(12) United States Patent
Fujioka et al.

(10) Patent No.: US 9,160,327 B2
(45) Date of Patent: Oct. 13, 2015

(54) SEMICONDUCTOR DEVICE AND INFORMATION PROCESSING APPARATUS

(71) Applicant: FUJITSU LIMITED, Kawasaki-shi, Kanagawa (JP)

(72) Inventors: Masaki Fujioka, Yokohama (JP); Koji Migita, Kawasaki (JP); Kazumasa Kubotera, Kawasaki (JP); Yasutaka Kanayama, Inagi (JP)

(73) Assignee: FUJITSU LIMITED, Kawasaki (JP)

( * ) Notice: Subject to any disclaimer, the term of this patent is extended or adjusted under 35 U.S.C. 154(b) by 26 days.

(21) Appl. No.: 13/901,140

(22) Filed: May 23, 2013

(65) Prior Publication Data

US 2013/0254434 A1    Sep. 26, 2013

Related U.S. Application Data

(63) Continuation of application No. PCT/JP2010/071173, filed on Nov. 26, 2010.

(51) Int. Cl.
*G06F 13/28* (2006.01)
*H03K 17/16* (2006.01)
*H03K 5/1252* (2006.01)
*H03K 19/003* (2006.01)

(52) U.S. Cl.
CPC .............. *H03K 17/16* (2013.01); *H03K 5/1252* (2013.01); *H03K 19/00361* (2013.01)

(58) Field of Classification Search
None
See application file for complete search history.

(56) References Cited

U.S. PATENT DOCUMENTS

| 2003/0042961 A1* | 3/2003 | Gomm | 327/276 |
| 2010/0102863 A1* | 4/2010 | Kojima | 327/158 |

FOREIGN PATENT DOCUMENTS

| JP | 08-274601 A | 10/1996 |
| JP | 10-13395 A | 1/1998 |
| JP | 10-322178 A | 12/1998 |
| JP | 2009-267908 A | 11/2009 |

OTHER PUBLICATIONS

Japanese Office Action dated Oct. 1, 2013, issued in corresponding Japanese Patent Application No. 2012-545586 with English translation (4 pages).
International Search Report for PCT/JP2010/071173, Mailing Date of Dec. 21, 2010.

* cited by examiner

*Primary Examiner* — Ilwoo Park
*Assistant Examiner* — Aurangzeb Hassan
(74) *Attorney, Agent, or Firm* — Westerman, Hattori, Daniels & Adrian, LLP

(57) ABSTRACT

A semiconductor device including an input terminal to receive an input signal and an output terminal to output an output signal includes delay elements connected in series with the input terminal and each to assign the delay to the input signal input from the input terminal, selectors connected to output sides of the delay elements and each to select one of output signals of the delay elements based on a selection signal for selecting the one of the output signals of the delay elements to return the selected one of the output signals to the output terminal, and delay circuits disposed corresponding to the selectors and each to cause switching of the selection signal input into a corresponding one of the selectors to occur after switching of a signal level of the input signal input into the corresponding one of the selectors serving as a signal turning point.

3 Claims, 14 Drawing Sheets

SEMICONDUCTOR DEVICE AND INFORMATION PROCESSING APPARATUS

CROSS-REFERENCE TO RELATED APPLICATIONS

The present application is a U.S. continuation application filed under 35 USC 111(a) claiming benefit under 35 U.S.C. 120 and 365(c) of PCT International Application No. PCT/JP2010/071173 filed on Nov. 26, 2010, the entire contents of which are incorporated herein by reference.

FIELD

The embodiments discussed herein are related to a semiconductor device and an information processing apparatus.

BACKGROUND

There is known in the art a signal delay device configured to adjust delay times of signals by assigning delay times to input signals and then outputting the delayed signals. The signal delay device may, for example, be implemented by a semiconductor device such as a large scale integrated circuit (LSI).

When signals output from such a signal delay device contain noise, an apparatus using the output signals may exhibit degraded operating behaviors. Hence, there may be disclosed in the related art, for example, a signal delay device including a plurality of delay circuits, and a selection circuit to select output signals of the delay circuits. The disclosed signal delay device may delay a selection signal indicating the selection made by the selection circuit corresponding to one of signals output from the delay circuits that has the longest delay time in order to prevent a noise generated by switching of the selection circuit from being contained in the output signals.

RELATED ART DOCUMENTS

Patent Document

Patent Document 1: Japanese Laid-open Patent Publication No. 8-274601

Since the related art signal delay device may delay the selection signal corresponding to one of the signals output from the delay circuits that has the longest delay time, the signal delay device may need to await the longest delay time, regardless of lengths of the delay times assigned to the input signals.

Thus, the related art signal delay device may exhibit a degraded response speed in duration from inputting the signal to outputting the delayed signal, which may be obtained by assigning a delay to the input signal.

Further, such a signal delay device, which may exhibit the degraded response speed of the output signal with respect to the input signal, may be unsuitable for an apparatus that may need to perform high-speed operations, and that may utilize an output signal as a clock signal such as a system clock.

SUMMARY

According to an aspect of an embodiment, there is provided a semiconductor device including an input terminal to receive an input signal and an output terminal to output an output signal, the output signal being obtained by assigning a delay to the input signal. The semiconductor device may include a plurality of delay elements connected in series with the input terminal and each configured to assign the delay to the input signal input from the input terminal; a plurality of selectors connected to respective output sides of the delay elements and each configured to select one of output signals of the delay elements based on a selection signal for selecting the one of the output signals of the delay elements so as to return the selected one of the output signals to the output terminal; and a plurality of delay circuits disposed corresponding to the selectors and each configured to cause switching of the selection signal input into a corresponding one of the selectors to occur after switching of a signal level of the input signal input into the corresponding one of the selectors serving as a signal turning point.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

Other objects, features, and advantages of the present invention will become more apparent from the following detailed description when read in conjunction with the accompanying drawings.

DESCRIPTION OF EMBODIMENTS

It may be desirable to provide a semiconductor device that is capable of suppressing a noise from being contained in the output signal, exhibiting a high response speed of the output signal with respect to the input signal and outputting an output signal that is suitable for a high-speed operation, and an information processing apparatus having such a semiconductor device.

Preferred embodiments of the present invention will be described with reference to the accompanying drawings. Specifically, the following description will be given of embodiments of a semiconductor device and an information processing apparatus having such a semiconductor device.

First, a signal delay circuit included in a comparative example of a semiconductor device will be described with reference to FIGS. 1 and 2 prior to illustration of a semiconductor device and an information processing apparatus of the embodiments.

Figure 1:
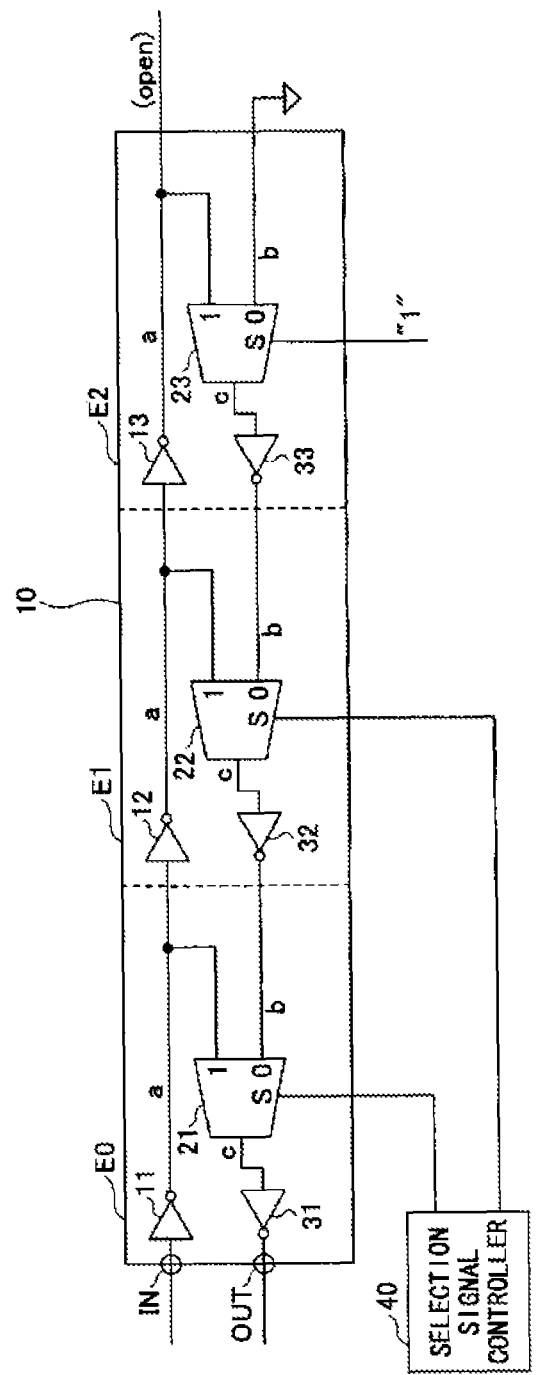
FIG. 1 is a circuit diagram illustrating a signal delay circuit included in a comparative example of a semiconductor device.

FIG. 1 is a circuit diagram illustrating a signal delay circuit included in a comparative example of a semiconductor device.

The signal delay circuit included in the comparative example of the semiconductor device illustrated in FIG. 1 may include a variable delay circuit 10, and a selection signal controller 40.

The variable delay circuit 10 may include inverters 11, 12 and 13, selectors 21, 22 and 23, and inverters 31, 32 and 33.

The inverters 11, 12 and 13 may serve as forwarding inverters configured to propagate signals to respective selectors 21, 22 and 23 serving as signal turning points. The inverters 31, 32 and 33 may serve as returning inverters configured to propagate the signals returned from the selectors 21, 22 and 23.

The inverters 11, 12 and 13, may serve as respective NOT circuits (i.e., inverter circuits) configured to invert input signals to output inverted signals.

The inverters 11, 12 and 13, may represent examples of delay devices connected in series by having their output terminals connected to their input terminals. The input terminal of the inverter 11 may be connected to an input terminal IN of the variable delay circuit 10, and the output terminal of the inverter 13 may have an open end (open) while being connected to a first input terminal of the selector 23.

The selectors 21, 22 and 23 may be disposed with respect to the inverters 11, 12 and 13. Each of the selectors 21, 22 and 23 may have two input terminals and a selection signal input terminal S, and be configured to select one of the input signals based on a selection signal input to the selection signal input terminal S to output the selected signal.

Note that a selection signal "1" or "0" may be input from the selection signal controller 40 into the respective selection signal input terminals S of the selectors 21 and 22. Further, a selection signal that exhibits a signal level clipped at "1" may be input into the selection signal input terminal S of the selector 23. For example, a predetermined voltage that represents the selection signal exhibiting the signal level at "1" may be generated by causing a resistor or the like to convert a power supply voltage, and the generated selection signal that exhibits the signal level at "1" may be input into the selection signal input terminal S of the selector 23.

Hence, each of the selectors 21 and 22 may select a selection signal (i.e., "1" or "0") input from the selection signal controller 40, and output the selected signal whereas the selector 23 may constantly select an output signal from the inverter 13 and output the selected output signal.

The inverters 31, 32 and 33 may serve as NOT circuits (i.e., inverter circuits) configured to invert input signals and output inverted signals, and be disposed corresponding to the selectors 21, 22 and 23. The inverters 31, 32 and 33 may be alternately connected to the selectors 21, 22 and 23 in series. The inverters 31, 32 and 33 may invert output signals of the selectors 21, 22 and 23 and output the inverted signals. The inverters 31, 32 and 33 may be examples of the delay devices.

The output terminal of the inverter 13 may be connected to a first input terminal of the selector 23. A second input terminal of the selector 23 may be grounded, and may receive "0" as fixed data.

The output terminal of the inverter 12 may be connected to the first input terminal of the selector 22, and the output terminal of the inverter 33 may be connected to the second input terminal of the selector 22.

The output terminal of the inverter 11 may be connected to the first input terminal of the selector 21, and the output terminal of the inverter 32 may be connected to the second input terminal of the selector 21.

The output terminal of the selector 21 may be connected to the input terminal of the inverter 31, and the output terminal of the inverter 31 may be connected to the output terminal OUT of the variable delay circuit 10.

The variable delay circuit 10 may select one of the selectors 21 to 22, from which the signal input into the input terminal IN is to be returned, so as to adjust a delay time of the signal input into the input terminal IN and output the adjusted signal from the output terminal OUT.

In the signal delay circuit included in the comparative example of the semiconductor device, the selection signals input to the selection signal input terminals S of the selectors 21 and 22 may each be 2-bit code represented by delay_code [1:0]. Each of the 2 bits of the delay_code [1:0] may acquire a value of "0" or "1". Each of the selectors 21 to 22 may select the input signal according to the value of the delay_code [1:0] input from the selection signal controller 40, and then output the selected signal.

Note that, as described above, the selection signal of the signal level clipped at "1" may be input into the selection signal input terminal S of the selector 23, which is disposed at a longest distance from the input terminal IN of the variable delay circuit 10. Hence, the selector 23 may constantly select the output signal of the inverter 13.

In the signal delay circuit included in the comparative example of the semiconductor device, when the selection signals input into the selectors 21 and 22 are "0" and "0", respectively, the selectors 21 and 22 may select output signals of the inverters 32 and 33, respectively. Hence, the selector 23 may serve as the signal turning point in the variable delay circuit 10.

When the selection signals input into the selectors 21 and 22 are "0" and "1", respectively, the selector 21 may select an output signal of the inverter 32 whereas the selector 22 may select an output signal of the inverter 12. Hence, the selector 22 may serve as the signal turning point in the variable delay circuit 10.

Note that in this case, the selector 23 may select the output signal of the inverter 13 and input the selected signal into the inverter 33; however, the output signal of the inverter 33 will not be selected by the selector 22. Hence, the selector 23 will not serve as the signal turning point.

When the selection signals input into the selectors 21 and 22 are "1" and "0", respectively, the selector 21 may select an output signal of the inverter 11. Hence, the selector 21 may serve as the signal turning point in the variable delay circuit 10.

Note that in this case, the selector 23 may select the output signal of the inverter 13 and input the selected signal into the inverter 33, and the output signal of the inverter 33 may be selected by the selector 22. However, the output signal of the inverter 32 will not be selected by the selector 21. Hence, the selector 23 will not serve as the signal turning point.

Note that the inverter 11, the selector 21, and the inverter 31 illustrated in FIG. 1 may be represented by the element E0. Note also that in the element E0, a signal input from the inverter 11 into the selector 21, a signal input from the inverter 32 into the selector 21, and a signal output from the selector 21 may be represented by a signal a, a signal b, and a signal c, respectively.

Similarly, the inverter 12, the selector 22, and the inverter 32 illustrated in FIG. 1 may be represented by an element E1. In addition, in the element E1, a signal input from the inverter 12 into the selector 22, a signal input from the inverter 33 into the selector 22, and a signal output from the selector 22 may be represented by a signal a, a signal b, and a signal c, respectively.

Further, the inverter 13, the selector 23, and the inverter 33 illustrated in FIG. 1 may be represented by an element E2. In addition, a signal input from the inverter 13 into the selector 23, a signal having a ground potential input into the selector 23, and a signal output from the selector 23 may be represented by a signal a, a signal b, and a signal c, respectively.

Next, operations of the signal delay circuit included in the comparative example of the semiconductor device will be described with reference to a timing chart illustrated in FIG. 2.

Figure 2:
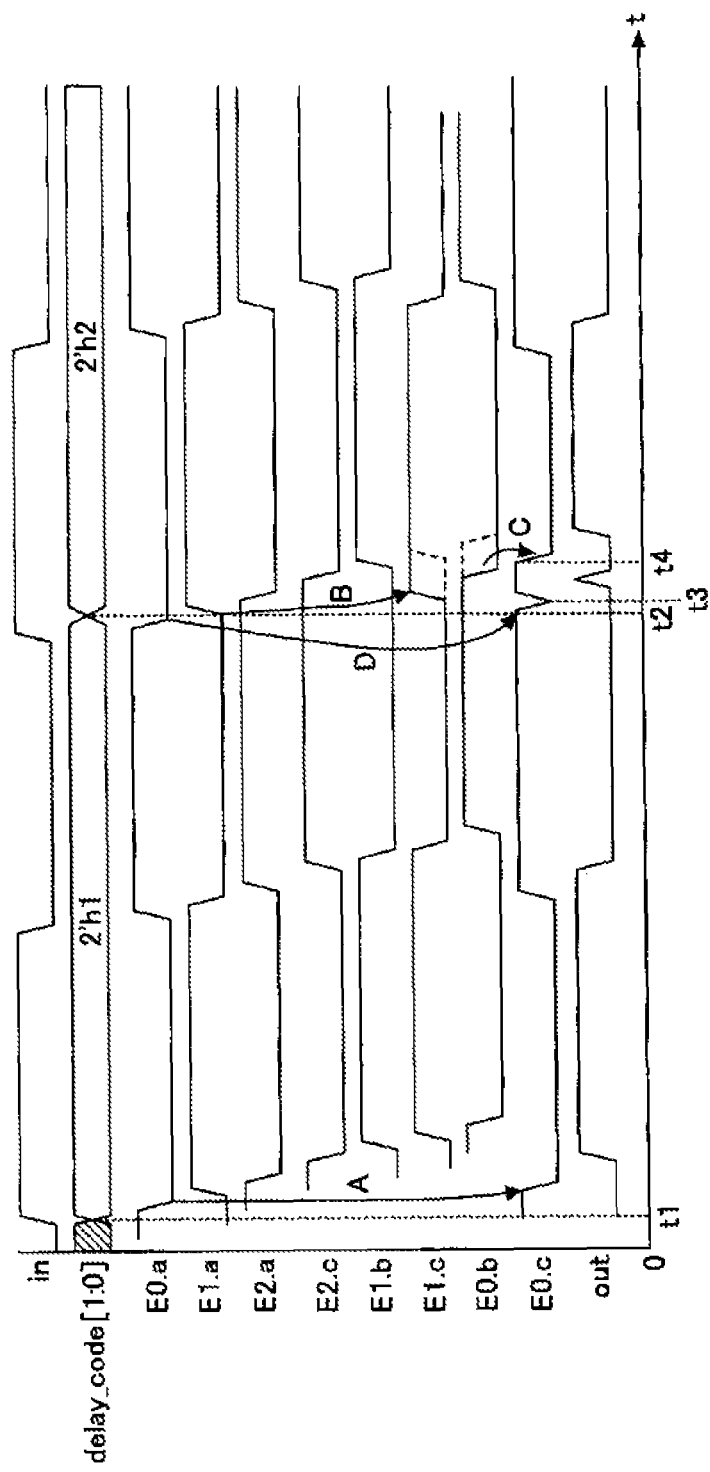
FIG. 2 is a timing chart illustrating operations of the signal delay circuit included in the comparative example of the semiconductor device.

FIG. 2 is a timing chart illustrating the operations of the signal delay circuit included in the comparative example of the semiconductor device.

Note that FIG. 2 illustrates a case where the value of the selection signal input from the selection signal controller 40 into each of the selectors 21 to 22 is changed into "1", changed from "1" to "0", and changed into "1".

Note that in FIG. 2, the delay_code [1:0] having the values of the selection signal of "1", "0" is represented by "2'h1", and the delay_code [1:0] having the value of the selection signal of "0", "1" is represented by "2'h2". Note that the diagonally shaded area in FIG. 2, which may illustrate a status of the delay_code [1:0] before the delay_code [1:0] becomes the "2'h1" status. That is, diagonally shaded area in FIG. 2 indicates that a status of the delay_code [1:0] may yet be determined.

Further, the signals a, b, and c of the element E0 may be represented by signals E0.a, E0.b, and E0.c, respectively. Similarly, the signals a, b, and c of the element E1 may be represented by signals E1.a, E1.b, and E1.c, respectively. Further, the signals a, b, and c of the element E2 may be represented by signals E2.a, E2.b, and E2.c, respectively.

Note that "in" denotes an input signal to be input into the input terminal IN, and "out" denotes an output signal to be output from the output terminal OUT.

When delay_code [1:0] becomes 2'h1 at time t1, the selector 21 serves as a signal turning point. Hence, a fall time of the signal E0.a reflecting the input signal in may be reflected in a fall time of the signal E0.c.

Further, in this case, the input signal in may be input into the inverter 12 within the element E1 and output as a signal E1.a. The signal E1.c may be acquired by allowing a signal E1.b to be output via the selector 22. The signal E1.c may be input into the element E0 as a signal E0.b via the inverter 32.

Further, the signal E1.a may be input into the inverter 13 within the element E2 and output as a signal E2.a. The output signal E2.a may be input as a signal E2.c via the selector 23. The signal E2.c may be input into the element E1 via the inverter 33 as a signal E1.b.

Hence, the signals E1.a, E2.a, E1.b, E1.c, and E0.b may each include a delay amount based on the number of inverters and the number of selectors via the signal has been input or output as illustrated in FIG. 2.

Note that when delay_code [1:0] becomes 2'h2 at time t2 immediately after the input signal in has entered a next cycle, the signal turning point may be switched from the selector 21 to the selector 22. Hence, a rise of the signal E1.a may be reflected in a rise of the signal E1.c, as indicated by an arrow B in FIG. 2.

Since the rise of the signal E1.c may appear at the time indicated by a broken line when no switching of the delay_code [1:0] has occurred, a cycle of the signal E1.c immediately after delay_code [1:0] has been switched at time t2 may be reduced as indicated by a solid line.

Further, since a signal level of the signal E1.c is inverted by the inverter 32 and a delay is applied to the signal E1.c to be output as a signal E0.b, the cycle of the signal E0.b may be reduced in a manner similar to that of the signal E1.c. Note that as a comparison, the signal E0.b indicated by a broken line in FIG. 2 illustrates timing of a fall time of the signal E0.b when no switching of the delay_code [1:0] has occurred.

Note that when the delay_code [1:0] is switched from 2'h1 to 2'h2, the selector 21 of the element E0 may change from a status in which the signal E0.a is selected into a status in which the signal E0.b is selected and output as the selected signal E0.c reflecting the signal E0.b. Hence, a fall time of the signal E0.b after the time t2 may be reflected in the signal E0.c, as indicated by an arrow C in FIG. 2.

Note that the signal E0.c may reflect the signal E0.a indicated by an arrow D in FIG. 2 to once exhibit the fall at time t3 before delay_code [1:0] is switched from 2'h1 to 2'h2 to reflect the signal E0.b.

Therefore, immediately after having once fallen at time t3 by switching delay_code [1:0] from 2'h1 to 2'h2, a signal level of the signal E0.c may become "1" and then fall again at time t4.

Since the signal E0.c may be reflected in the output signal out, the output signal out may have risen again immediately after having once risen before and after the time t3 or t4. Hence, the output signal out may acquire noise.

When the output signal out obtains noise, an apparatus employing the output signal out as a system clock may exhibit abnormal operating behaviors.

The noise contained in the output signal may be generated by switching delay_code [1:0] serving as a selection signal before the switching of the signal level of the signal input into the selector, which serves as a signal turning point for a new signal, has been completed.

Note that the comparative example describes a case where one of the signal turning points may be switched to the signal turning point that is disposed at a longest distance from the input terminal IN or the output terminal OUT of the variable delay circuit 10. However, it may be possible to observe a similar effect in a case where one of the signal turning points may be switched to the signal turning point that is disposed at a shortest distance from the input terminal IN or the output terminal OUT of the variable delay circuit 10.

As described above, in the comparative example of the semiconductor device, when the signal turning point of the signal delay circuit is switched, the output signal out may contain noise. As a result, the apparatus employing the output signal out as a system clock may exhibit abnormal operating behaviors.

Accordingly, a first and a second embodiments that will be described below may provide a semiconductor device and an information processing apparatus that may overcome limitation and disadvantages of the comparative example of the semiconductor device. Preferred embodiments of the present invention will be described with reference to the accompanying drawings. Specifically, a description will be given of a semiconductor device of the first and the second embodiments, and an information processing apparatus having such semiconductor devices.

First Embodiment

In the following description, those elements of the semiconductor device of the first embodiment that are the same as or equivalent to those of the comparative example are designated by the same reference numerals, and a description thereof will be omitted.

Figure 3:
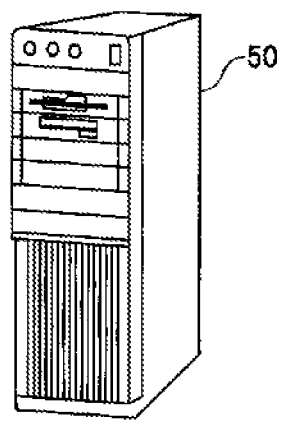
FIG. 3 is a diagram illustrating a server 50 including a semiconductor device of a first embodiment.

FIG. 3 is a diagram illustrating a server 50 including the semiconductor device of the first embodiment.

The server 50 illustrated in FIG. 3 may be an example of the information processing apparatus including the semiconductor device of the first embodiment. The server 50 may, for example, include a central processing unit (CPU), a main storage unit, and the like.

Figure 4:
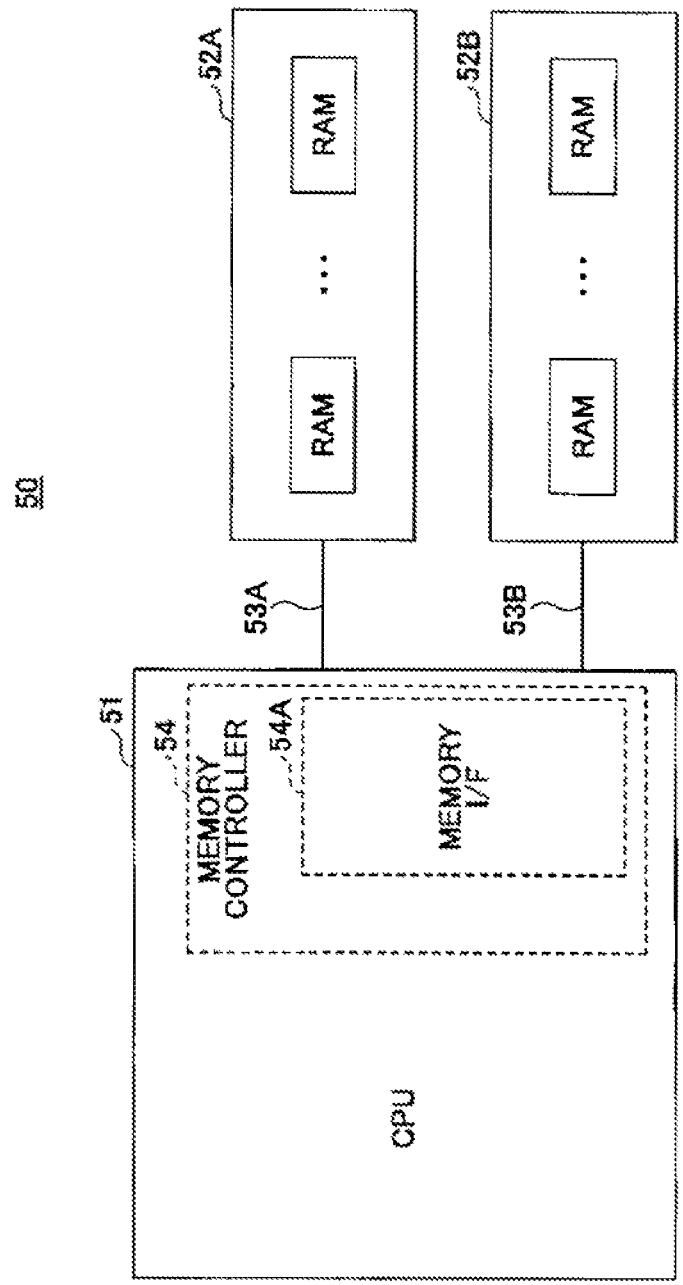
FIG. 4 is a block diagram illustrating the server 50 including the semiconductor device of the first embodiment.

FIG. 4 is a block diagram illustrating the server 50 including the semiconductor device of the first embodiment.

The server 50 may, for example, include a CPU 51, and main storage units 52A and 52B. The CPU 51 and the main storage units 52A and 52B may be connected via buses 53A and 53B, respectively.

The CPU 51 may include a memory controller 51 and may acquire or transfer data between the main storage units 52A and 52B via a memory interface (I/F) 54A within the memory controller 54 while carrying out a process on the acquired data.

Each of the main storage units 52A and 52B may, for example, include a plurality of modulated random access memories (RAMs). Note that the example of the server 50 in FIG. 4 includes two main storage units 52A and 52B; however, the server 50 may include three or more main storage units.

The memory controller 54 may transfer data between the CPU 51 and each of the main storage units 52A and 52B. The memory controller 54 may include the memory interface (I/F) 54A for implementing data communications in an interface between the main storage units 52A and 52B.

The semiconductor device of the first embodiment may, for example, serve as the memory controller 54 that includes a signal delay circuit within the memory I/F 54A. FIG. 4 illustrates a configuration of the server 50 in which the CPU 51 includes the memory controller 54; however, the memory controller 54 may be disposed outside the CPU 51. Alternatively, the semiconductor device of the first embodiment may be a chip set including the memory controller 54.

Note that the signal delay circuit may be an example of the signal delay device configured to output an output signal obtained by assigning a delay time to an input signal. The output signal of the signal delay circuit included in the semiconductor device of the first embodiment may, for example, be used as a system clock for the memory controller 54 to carry out data transfer between the main storage units 52A and 52B.

Next, a description will be given of the semiconductor device of the first embodiment with reference to FIGS. 5 to 8.

Figure 5:
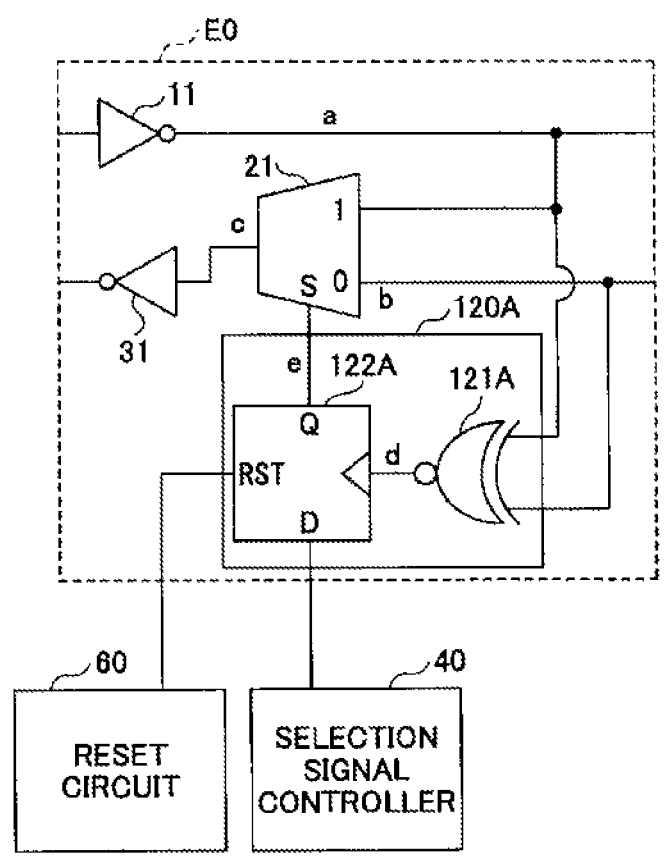
FIG. 5 is a circuit diagram illustrating a part of a variable delay circuit within the signal delay circuit included in the semiconductor device of the first embodiment.

FIG. 5 is a circuit diagram illustrating a part of a variable delay circuit within the signal delay circuit included in the semiconductor device of the first embodiment.

A circuit illustrated in FIG. 5 may be an element E0 of the variable delay circuit within the signal delay circuit included in the semiconductor device of the first embodiment. The element E0 illustrated in FIG. 5 may correspond to the element E0 of the variable delay circuit 10 within the signal delay circuit included in the comparative example of the semiconductor device illustrated in FIG. 1.

The element E0 of the variable delay circuit 110 within the signal delay circuit included in the semiconductor device of the first embodiment may include a delay circuit 120A as well as an inverter 11, a selector 21, and an inverter 31.

The delay circuit 120A may include an exclusive NOR (Ex-NOR) circuit 121A, and a flip-flop (FF) 122A.

The Ex-NOR circuit 121A may include a pair of input terminals to which a signal a and a signal b may be input, respectively. The Ex-NOR circuit 121A may further include an output terminal connected to a clock input terminal of the FF 122A.

The FF 122A may include a data input terminal D connected to a selection signal control circuit 40, a data output terminal Q connected to a selection signal input terminal S of the selector 21, and the clock input terminal connected to the output terminal of the Ex-NOR circuit 121A.

When a rising edge of the output of the Ex-NOR circuit 121A is input into the clock input terminal of the FF 122A, the FF 122A may reflect in the data output terminal Q a value of a selection signal that is input to its data input terminal D from the selection signal control circuit 40.

In addition, reset data for resetting the value of the data output terminal Q may be input into a reset terminal RST from a reset circuit 60. A value of the data input terminal D of the FF 122A may, for example, be reset to "0" after turning on the power of the signal delay circuit included in the semiconductor device of the first embodiment.

Note that in FIG. 5, a signal d denotes the output of the Ex-NOR circuit 121A, and a signal e denotes a signal that may be output from the data output terminal Q of the FF 122A and then input into the selection signal input terminal S of the selector 21.

Next, a description will be given, with reference to FIGS. 6A and 6B, of operations of the element E0 of the variable delay circuit within the signal delay circuit included in the semiconductor device of the first embodiment.

Figure 6A:
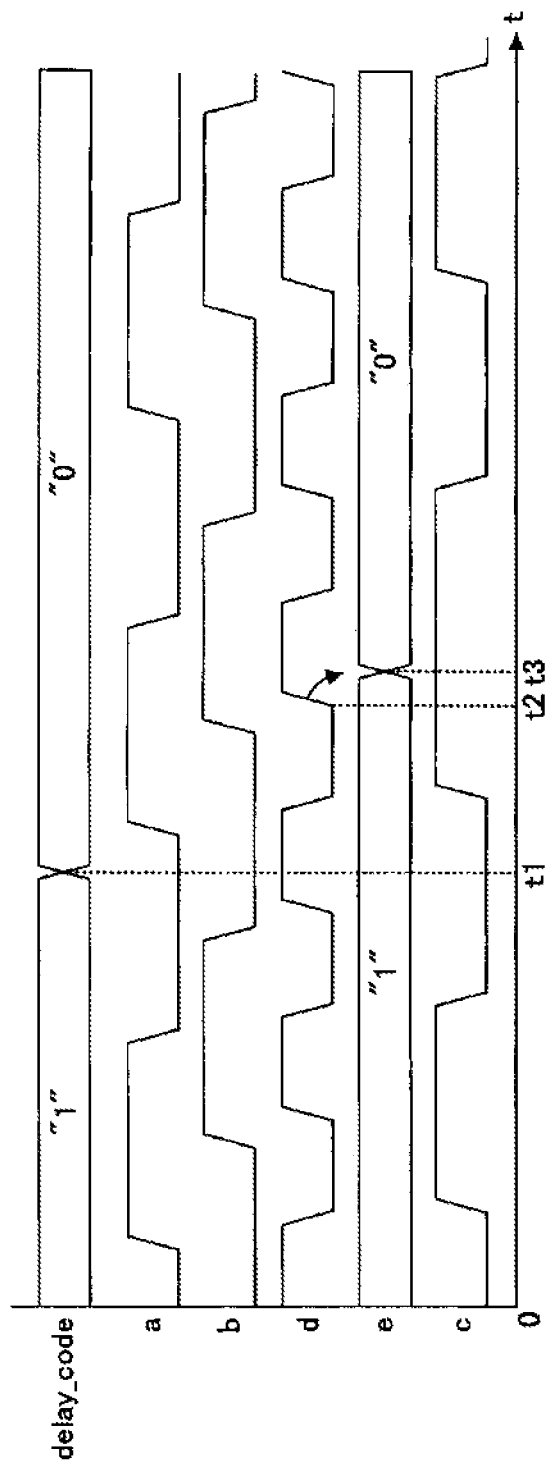
FIG. 6A is a timing chart illustrating operations of an element E0 of the variable delay circuit within the signal delay circuit included in the semiconductor device of the first embodiment.
Figure 6B:
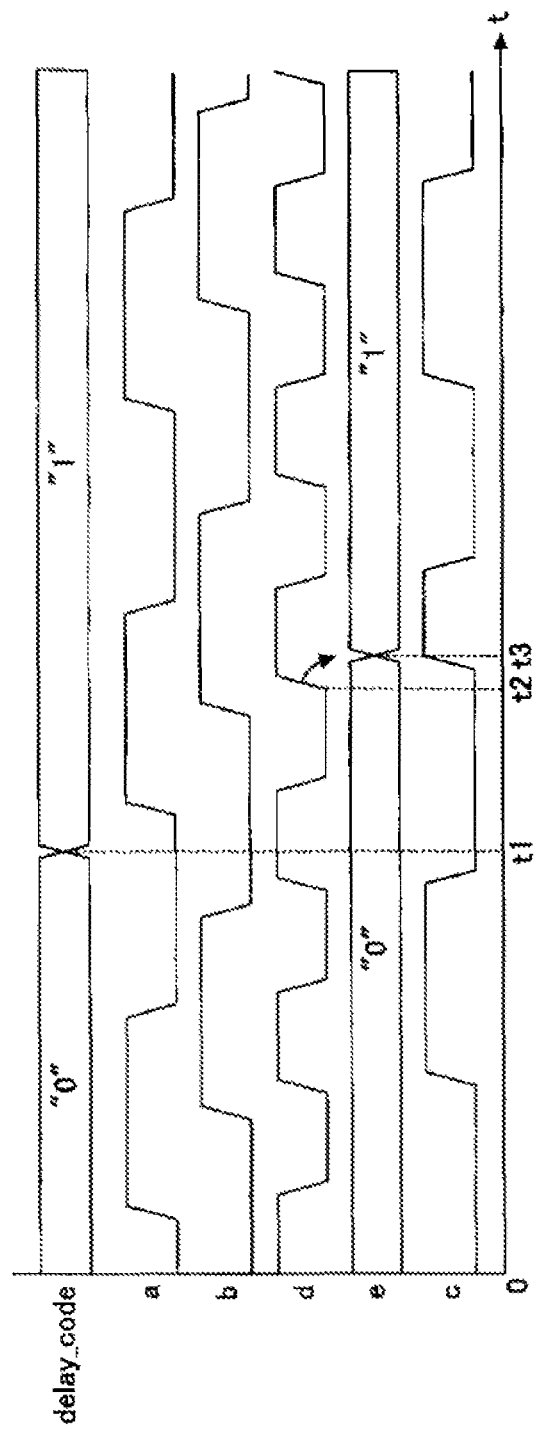
FIG. 6B is another timing chart illustrating operations of the element E0 of the variable delay circuit within the signal delay circuit included in the semiconductor device of the first embodiment.

FIGS. 6A and 6B are timing charts illustrating operations of the element E0 of the variable delay circuit within the signal delay circuit included in the semiconductor device of the first embodiment.

FIGS. 6A and 6B illustrate transitions of signal levels of delay_code, and signals a, b, c, d, and e. In FIGS. 6A and 6B, a horizontal axis indicates a time axis, and a rightward direction indicates a positive direction.

The timing charts illustrated in FIGS. 6A and 6B are the timing chart of one element E0 illustrated FIG. 5, and hence, a selection signal is represented by a 1-bit delay_code. In FIGS. 6A and 6B, a value of delay_code may be "0" or "1".

FIG. 6A illustrates a timing chart when the value of delay_code is switched from "1" to "0", whereas FIG. 6B illustrates a timing chart when the value of the delay_code is switched from "0" to "1".

In FIGS. 6A and 6B, since the signal b may represent the signal a that returns to the output terminal OUT (see FIG. 1) via the not-illustrated right-hand side elements (e.g., the elements E1 and E2 illustrated in FIG. 1), the signal b may be behind the signal a.

Initially, as illustrated in FIG. 6A, the delay_code may be reflected in a value of a signal e such that the value of the signal e may become "1" at time t0 when the value of delay_code is switched from "1" to "0".

In this case, since the signal e of a signal level at "1" is input into the selection signal input terminal S of the selector 21 of the element E0, the selector 21 may select the signal a and output the selected signal a.

Hence, a signal c representing the output of the selector 21 may have a signal waveform obtained by assigning a delay time of the selector 21 to the signal a when the value of the signal e is "1" after the time t0.

Further, since the Ex-NOR circuit 121A outputs an exclusive-NOR of the signal a and the signal b, the Ex-NOR circuit 121A may output "1" when the values of the signal a and the signal b have an identical signal level, but output "0" when the values of the signal a and the signal b have different signal levels. Note that a similar observation may be made when the delay_code is switched to "0" at time t1.

Next, the delay_code may be switched to "0" at time t1; however, the signal d will not rise until time t2 after time t1. Hence, the value of the signal e that may be input as the selection signal into the selection signal input terminal S of the selector 21 will not be updated until the signal e reaches time t2.

When the signal e is updated from "1" to "0" at time t3 due to the rise of the signal d at time t2, the selector 21 may select the signal b. Hence, the signal c representing the output of the selector 21 may exhibit a signal waveform obtained by assigning the delay time of the selector to the signal b after time t3.

The signal c not containing a noise resulting from the switching of delay_code may thus be generated.

Next, as illustrated in FIG. 6B, the delay_code may be reflected in the value of the signal e such that the value of the signal e becomes "0" at time t0 when the value of delay_code is switched from "0" to "1".

In this case, since the signal e of the signal level at "0" is input into the selection signal input terminal S of the selector 21 of the element E0, the selector 21 may select the signal b and output the selected signal b.

Hence, the signal c representing the output of the selector 21 may have a signal waveform obtained by assigning a delay time of the selector 21 to the signal b during the value of the signal e being "0" after the time t0.

Further, since the Ex-NOR circuit 121A outputs an exclusive-NOR of the signal a and the signal b, the Ex-NOR circuit 121A may output "1" when the values of the signal a and the signal b indicate an identical signal level, but may output "0" when the values of the signal a and the signal b indicate different signal levels. Note that a similar observation may be made when the delay_code is switched to "1" at time t1.

Next, delay_code may be switched to "1" at time t1; however, the signal d will not rise until time t2 after time t1. Hence, the value of the signal e that is input as the selection signal into the selection signal input terminal S of the selector 21 will not be updated until the signal e reaches time t2.

When the signal e is updated from "1" to "0" at time t3 due to the rise of the signal d at time t2, the selector 21 may select the signal a. Hence, the signal c representing the output of the selector 21 may exhibit a signal waveform obtained by assigning the delay time of the selector 21 to the signal a after time t3.

Next, a description will be given, with reference to FIG. 7, of circuits of the variable delay circuit within the signal delay circuit included in the semiconductor device of the first embodiment.

Figure 7:
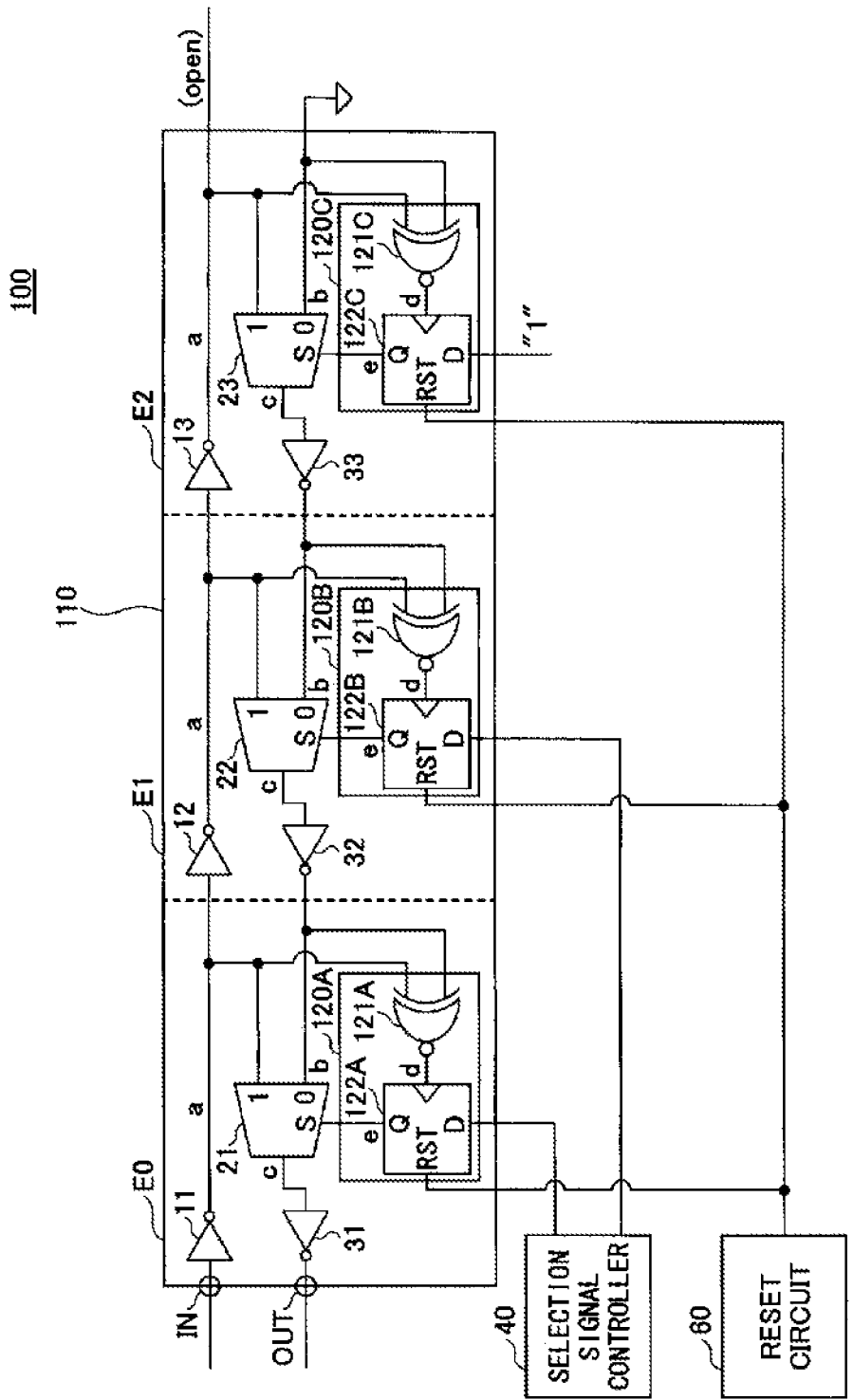
FIG. 7 is a circuit diagram illustrating a signal delay circuit 100 included in the semiconductor device of the first embodiment.

FIG. 7 is a circuit diagram illustrating a signal delay circuit 100 included in the semiconductor device of the first embodiment.

The signal delay circuit 100 included in the semiconductor device of the first embodiment may include a variable delay circuit 110, a selection signal controller 40, and a reset circuit 60.

The variable delay circuit 110 of the signal delay circuit 100 included in the semiconductor device of the first embodiment may have a circuit configuration obtained by adding delay circuits 120A, 120B, and 120C to the respective elements E0, E1 and E2 of the variable delay circuit 10 (see FIG. 1) of the comparative example of the semiconductor device. Therefore, those elements of the variable delay circuit 110 of the semiconductor device of the first embodiment that are the same as or equivalent to those of the variable delay circuit 10 in the comparative example are designated by the same reference numerals, and a description thereof will be omitted.

The semiconductor device including the signal delay circuit 100 may be implemented by a large-scale integrated circuit (LSI) fabricated by a semiconductor fabrication technology.

The element E0 of the variable delay circuit 110 of the signal delay circuit 100 illustrated in FIG. 7 is identical to the element E0 illustrated in FIG. 5. One of the input signals input into the Ex-NOR circuit 121A of the delay circuit 120A may be an output signal of the inverter 11 of the element E0, whereas the other input signal may be an output signal of the inverter 32 of the element E1.

The element E1 illustrated in FIG. 7 may have a circuit configuration including the comparative example of the element E1 and a delay circuit 120B. The delay circuit 120B may include an exclusive NOR (Ex-NOR) circuit 121B, and a flip-flop (FF) 122. One of input signals of the Ex-NOR circuit 121B may be an output signal of the inverter 12 of the element E1, whereas the other input signal may be an output signal of the inverter 33 of the element E2.

An output terminal of the Ex-NOR circuit 121B may be connected to a clock input terminal of the FF 122B. Since the Ex-NOR circuit 121B outputs an exclusive-NOR of the signal a and the signal b, the Ex-NOR circuit 121B may output "1" when the values of the signal a and the signal b indicate an identical signal level, but the Ex-NOR circuit 121B may output "0" when the values of the signal a and the signal b indicate different signal levels.

A data input terminal D of the FF 122B may be connected to the selection signal controller 40, a data output terminal Q of the FF 122B may be connected to a selection signal input terminal S of the selector 22, and a clock input terminal of the FF 122B may be connected to an output terminal of the Ex-NOR circuit 121B.

When a rise of the output of the Ex-NOR circuit 121B is input into the clock input terminal of the FF 122B, the FF 122B may reflect in the data output terminal Q a value of a selection signal that is input to the data input terminal D from the selection signal control circuit 40.

In addition, reset data for resetting the value of the data output terminal Q may be input into a reset terminal RST from a reset circuit 60. The value of the data input terminal D of the FF 122B may, for example, be reset to "0" after turning on the power of the signal delay circuit 100.

The element E2 illustrated in FIG. 7 may have a circuit configuration including the comparative example of the element E2 and a delay circuit 120C. The delay circuit 120C may include an exclusive NOR (Ex-NOR) circuit 121C, and a flip-flop (FF) 122. One of input signals of the Ex-NOR circuit 121C may be an output signal of the inverter 13 of the element E2, whereas the other input signal may constantly be a fixed value of "0".

An output terminal of the Ex-NOR circuit 121C may be connected to a clock input terminal of the FF 122C. Since the Ex-NOR circuit 121C outputs an exclusive-NOR of the signal a and the signal b, the Ex-NOR circuit 121C may output "1" when the values of the signal a and the signal b indicate an identical signal level, but the Ex-NOR circuit 121C may output "0" when the values of the signal a and the signal b indicate different signal levels.

A data input terminal D of the FF 122C may receive a selection signal of a signal level clipped at "1", an output signal of a data output terminal Q of the FF 122C may be input into a selection signal input terminal S of the selector 23, and a clock input terminal of the FF 122C may be connected to an output terminal of the Ex-NOR circuit 121C.

When the rise of the output of the Ex-NOR circuit 121C is input into the clock input terminal of the FF 122C, the FF 122C may reflect a selection signal of a signal level clipped at "1" in the data output terminal Q.

In addition, reset data for resetting the value of the data output terminal Q may be input into a reset terminal RST from a reset circuit 60. The value of the data input terminal D of the FF 122C may, for example, be reset to "0" after turning on the power of the signal delay circuit 100.

Note that FIG. 7 illustrates the three elements E0, E1 and E2 for convenience of illustration; however, the number of elements is not limited to three. That is, the number of elements may be three or more. For example, in a case where the signal delay circuit 100 included in the semiconductor device of the first embodiment is employed in a memory I/F 54A (see FIG. 4), the number of elements may, for example, be 64 or more; or the number of elements may alternatively be 128 or more.

Next, a description will be given, with reference to FIG. 8, of operations of the signal delay circuit 100 included in the semiconductor device of the first embodiment illustrated in FIG. 7.

Figure 8:
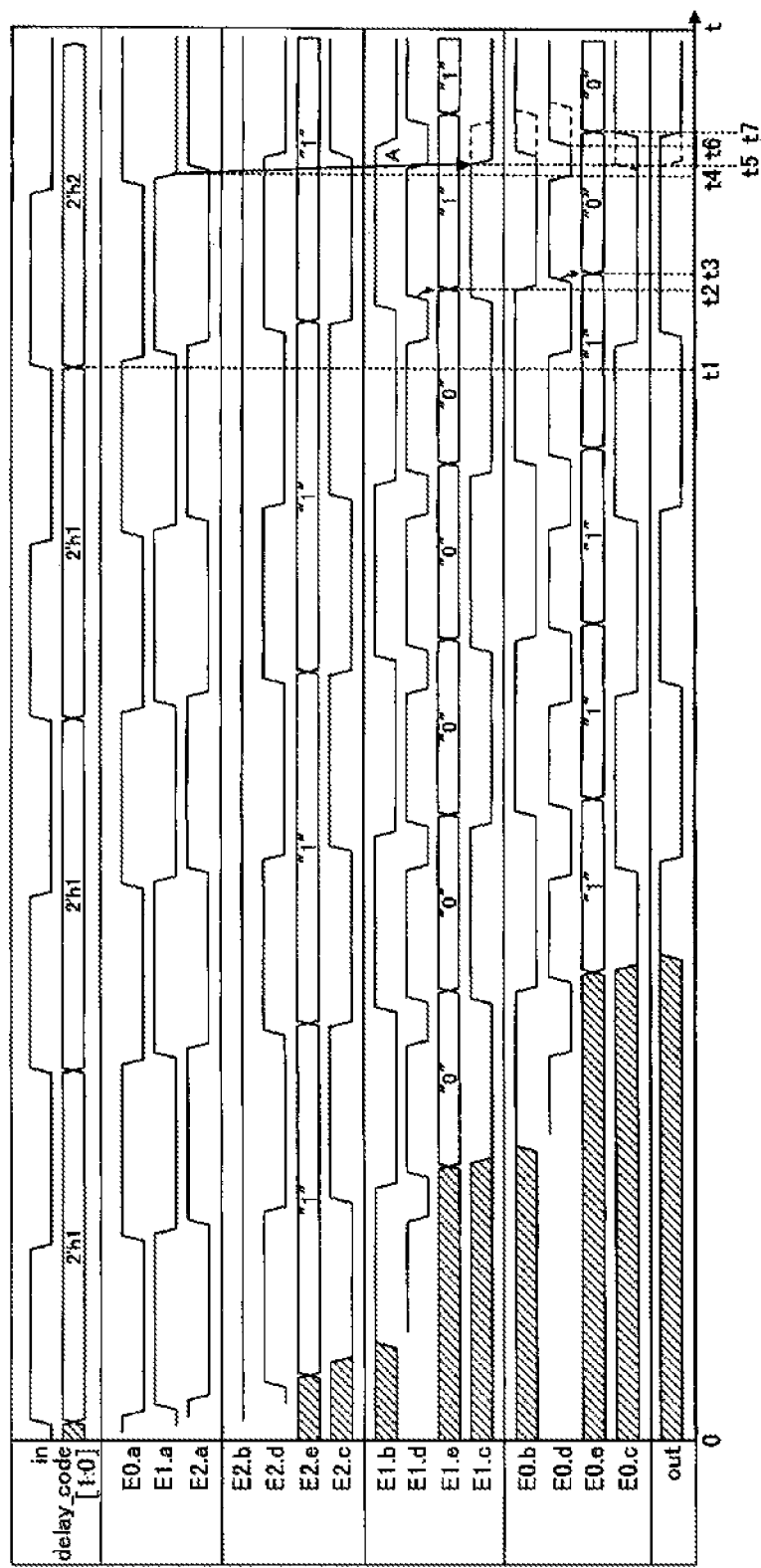
FIG. 8 is a timing chart illustrating operations of the signal delay circuit 100 included in the semiconductor device of the first embodiment.

FIG. 8 is a timing chart illustrating the operations of the signal delay circuit 100 included in the semiconductor device of the first embodiment.

FIG. 8 illustrates transitions of signal levels of an input signal in, the delay_code [1:0], signals a, b, c, d, and e within the elements E0, E1 and E2, and an output signal out. In FIG. 8, a horizontal axis indicates a time axis, and a rightward direction indicates a positive direction.

FIG. 8 illustrates the timing chart when delay_code [1:0] input into each of data input terminals D of the FF 122A and the FF 122B is switched from 2'h1 to 2'h2.

The delay_code [1:0] for 2'h1 may be configured to input values "1" and "0" into the FF 122A and the FF 122B, respectively, whereas the delay_code [1:0] for 2'h2 may be configured to input values "0" and "1" into the FF 122A and the FF 122B, respectively.

That is, the timing chart in FIG. 8 may illustrate signal level transitions when a signal turning point is switched from the selector 21 within the element E0 to the selector 22 within the element E1.

As illustrated in FIG. 8, a description is given of a case where the delay_code [1:0] is set to 2'h1 from the first cycle to the third cycle of the input signal in, and the setting of the delay_ode [1:0] is switched to 2'h2 when the input signal in enters the fourth cycle. Note that the setting of the delay_code [1:0] may be performed by the selection signal controller 40 (see FIG. 7).

Note that the delay_code [1:0] may be set to 2'h1 for the first three cycles of the input signal in and switched to 2'h2 for the fourth cycle of the input signal in. This is because the signal turning point may preferably be switched after the input signal in is propagated in a stepwise manner from the element E0 located closer to the input terminal IN to the element E2 located farther from the input terminal IN. Hence, the propagated input signal in may be reflected in the output signal out.

The signals E0.a, E1.a, and E2.a may be obtained by causing the inverters 11, 12, and 13 to invert the input signal in, and hence, the signals E0.a, E1.a, and E2.a may each have a waveform to which the delay time is assigned.

Since a fixed value "0" is set to the signal E2.b, the signal E2.B may maintain a value "0" despite the face that the time has progressed.

Since the signal E2.d is an output of the Ex-NOR circuit 121C, the value of the signal E2.d may be "1" during the value of the signal E2.a being "0" whereas the value of the signal E2.d may be "0" during the value of the signal E2.a being "1".

The signal E2.e may be updated at the rising edge of the signal E2.d. Since a selection signal of a signal level clipped at "1" is input into the data input terminal D of the FF 122C, the value of the signal E2.e may be set to "1" every time the signal E2.d is updated. This may allow the selector 23 to constantly select the signal a.

Note that an initial value of the signal E2.e is illustrated by a diagonally shaded area because the value of the input signal in is yet to be propagated and is not fixed. Other initial values of signals subsequent to the signal E2.e in FIG. 8 may be represented by diagonally shaded areas in manners and reasons similar to those of the signal E2.e.

The signals E2.c may represent a signal obtained by assigning the delay time of the selector 23 to the signal E2.a. Hence, the signal E2.c may have a waveform to which the delay time of the signal E2.a is assigned.

The signal E1.b may be obtained by causing the inverter 33 to invert a signal level of the signal E2.c, and hence, the signal E1.b may have a waveform to which the delay time is assigned.

The signal E1.d may be obtained as a result of an exclusive NOR of the value of the signal E1.a and the value of the signal E1.b. Hence, the value of the signal E1.d may be "1" when the value of the signal E1.a is identical to that of the signal E1.b, whereas the value of the signal E1.d may be "0" when the value of the signal E1.a differs from that of the signal E1.b.

Since the signal E1.e is an output signal output from the data output terminal Q of the FF 122B, the signal E1.e may reflect the value input into the data input terminal D of the FF 122B at a rising edge of the signal E1.d. Hence, the value of the signal E1.e may be "0" while the delay_code [1:0] is set to 2'h1.

The signal E1.c may represent an output value of the selector 22. The selector 22 may select an output of the inverter 33 while the selector 21 serves as the signal turning point. Hence, the signal E1.c may have a signal waveform obtained by assigning the delay time of the selector 22 to the signal E1.b while the selector 21 serves as the signal turning point.

The signal E0.b may be obtained by causing the inverter 32 to invert the signal E1.c as well as assigning the delay time to the signal W1.c. Hence, the signal E0.b may have a waveform obtained by inverting the signal E1.c as well as assigning the delay time to the signal E1.c.

The signal E0.d may be obtained as a result of an exclusive NOR of the signal E0.a and the signal E0.b. Hence, the value of the signal E0.d may be "1" while a signal level of the signal E0.a is identical to that of the signal E0.b, whereas the value of the signal E0.d may be "0" while the signal level of the signal E0.a differs from that of the signal E0.b.

Since the signal E0.e is a signal output from the data output terminal Q of the FF 122A, the signal E0.e may reflect the value input into the data input terminal D of the FF 122A at a rising edge of the signal E0.d. Hence, the value of the signal E0.e may be "1" while the delay_code [1:0] is set to 2'h1.

The signal E0.c may represent an output value of the selector 21. The selector 21 may select an output of the inverter 11 while the selector 21 serves as the signal turning point. Hence, the signal E0.c may have a signal waveform obtained by assigning the delay time of the selector 21 to the signal E0.a while the selector 21 serves as the signal turning point.

The output signal out may be obtained by causing the inverter 31 to invert the signal E0.c as well as assigning the delay time to the signal E0.c. Hence, the output signal out may have a waveform obtained by inverting the waveform of the signal E0.c as well as assigning the delay time to the waveform of the signal E0.c.

In the signal delay circuit 100 included in the semiconductor device of the first embodiment, when the delay_code [1:0] is switched from 2'h1 to 2'h2 at time t1 where the input signal in enters the fourth cycle, the signal E1.e may be updated with the value "1" at a rise of the signal E1.d at time t2. In addition, the signal E1.e may be updated with the value "0" at a rise of the signal E0.d at time t3. Accordingly, the signal turning point may be switched from the selector 21 to the selector 22.

When the signal turning point is switched to the selector 22, the signal E1.c may switch a reflecting target from the signal E1.b to the signal E1.a so as to reflect the value of the signal E1.a.

Specifically, a fall of the signal E1.a at time t4 may be reflected in a fall of the signal E1.c at time t5, as indicated by an arrow A in FIG. 8. Note that the waveform of the signal E1.c indicated by a broken line subsequent to time t5 may be the waveform of the signal E1.c when no switching of the delay_code [1:0] has occurred at time t1.

The fall of the signal E1.c at time t5 may be propagated to the signal E0.b, and the signal E0.e may be updated with the value "0" again at time t7 by the rise of the signal E0.d at time t6.

In addition, the signal E0.c may have a transitioned waveform obtained by assigning the delay time of the selector 21 to the signal E0.b, whereas the output signal out may have a transitioned waveform obtained by causing the inverter 31 to invert the signal E0.c as well as assigning the delay time to the signal E0.c.

Note that the waveforms of the signals E1.c, E0.b, E0.d, and E0.c and the waveform of the output signal out indicated by the respective broken lines subsequent to time t4 may represent respective waveforms when no switching of the delay_code [1:0] has occurred at time t1.

As described above, the signal delay circuit 100 included in the semiconductor device of the first embodiment may be able to output the signal output out not containing a noise resulting from the switching of the selection signal (i.e., delay_code [1:0]).

Further, when switching the selection signal (i.e., delay_code [1:0]), the signal delay circuit 100 may await the switching of the input signal, and may then input the switched selection signal into the selection signal input terminal S of the selector.

This indicates, as illustrated in the example in FIG. 8, that the signal delay circuit 100 awaits the switching of the signal levels of the signals E1.a and E1.b input into the selector 22 serving as the new signal turning point, and then switches the signal E1.e input into the selection signal input terminal S of the selector at time t2 after the selection signal (i.e., delay_code [1:0]) has been switched at time t1.

This may indicate that the delay circuit 120B causes the switching of the selection signal input into the selector 22 to occur after the switching of the signal level of the input signal input into the selector 22 serving as the signal turning point.

FIG. 7 illustrates an example of the signal delay circuit 100 included in the semiconductor device of the first embodiment, in which three elements E0, E1 and E2 are disposed. However, in a case where the signal delay circuit 100 included in the semiconductor device of the first embodiment is employed within the memory I/F 54A, the number of elements may, for example, be 64 or more, or may alternatively be 128 or more.

Thus, when numerous elements are disposed in the signal delay circuit 100, and the signal is returned at the element having the longest distance from the input terminal IN and the output terminal OUT of the signal delay circuit 100, the delay time assigned to the input signal in input from the input terminal IN may be obtained by multiplying the delay time, at which the signal is returned at the element having the shortest distance from the input terminal IN and the output terminal OUT, by the number of elements. That is, when the number of elements is 64, the delay time of the element having the longest distance from the input terminal IN and the output terminal OUT may be 64 times the delay time of the element having the shortest distance from the input terminal IN and the output terminal OUT. Likewise, when the number of elements is 128, the delay time of the element having the longest distance may be 128 times the delay time of the element having the shortest distance.

As illustrated above, the signal delay circuit 100 included in the semiconductor device of the first embodiment may cause the switching of the selection signal input by the delay circuit into the selector to occur after the switching of the signal level of the input signal input into the selector serving as the signal turning point. The above delaying process may remain the same regardless of the number of elements disposed in the signal delay circuit 100.

Then, the delay time for causing a delay of the switching of the selection signal input into the selector may be determined by a position of the element having the selector serving as the signal turning point counted from the input terminal IN and the output terminal OUT. That is, the delay time for causing a delay of the switching of the selection signal input into the selector may be determined based on what number element from the input terminal IN and the output terminal OUT includes the selector serving as the signal turning point.

Hence, in the signal delay circuit 100 included in the semiconductor device of the first embodiment, a response of the output signal out output from the output terminal OUT with respect to the input signal in input into the input terminal IN may be determined based on a position of the element serving as the signal turning point.

Hence, the first embodiment may provide the semiconductor device capable of exhibiting a high response speed of the output signal with respect to the input signal and being suitable for high-speed operations, and information processing apparatus having such a semiconductor device.

Note that in the above circuit configuration of the first embodiment, the delay circuits 120A to 120C include the Ex-NOR circuits 121A to 121C, respectively. However, the delay circuits 120A to 120C may, for example, each include a combination of an exclusive OR (Ex-OR) circuit and an inverter (NOT) circuit.

In the above description, the signal delay circuit 100 included in the semiconductor device of the first embodiment is illustrated. However, a delay locked loop (DLL) may be constructed by adding a function to compare phases of the input signal in and the output signal out to the signal delay circuit 100 to control a phase difference between the phases of the input signal in and the output signal out, such that the phase difference matches a predetermined target value. That is, the signal delay circuit 100 included in the semiconductor device of the first embodiment may be utilized as a part of the DLL.

Second Embodiment

A signal delay circuit 200 included in a semiconductor device of a second embodiment may have a circuit configuration of delay circuits that differs from that of the first embodiment. In the following description, those elements that are the same as or equivalent to those of the first embodiment are designated by the same reference numerals, and a description thereof will be omitted. Further, the following description will mainly focus on the difference in the circuit configuration between the first embodiment and the second embodiment.

Figure 9:
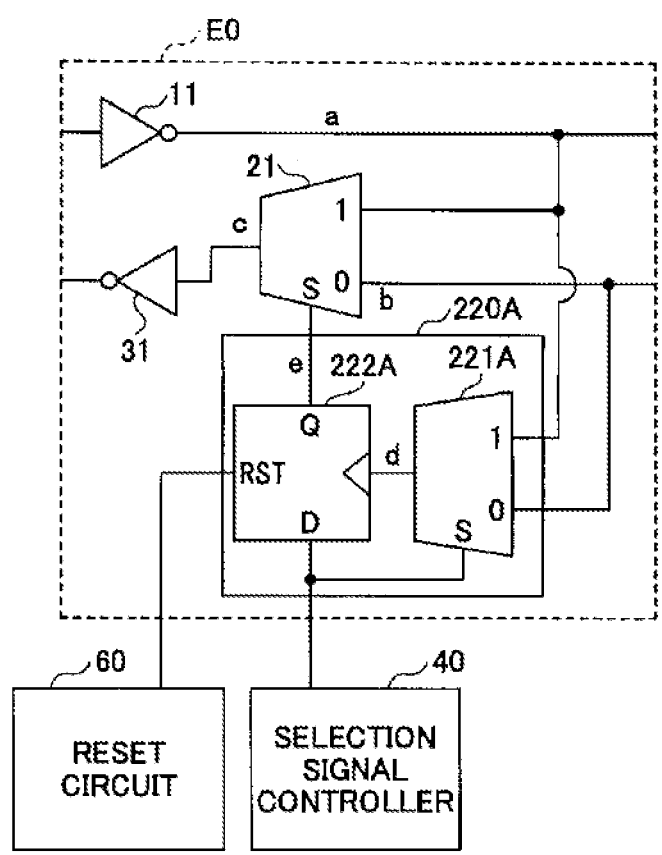
FIG. 9 is a diagram illustrating a circuit configuration of an element E0 within a variable delay circuit of a signal delay circuit 200 included in a semiconductor device of a second embodiment.

FIG. 9 is a diagram illustrating a circuit configuration of an element E0 within a variable delay circuit of a signal delay circuit 200 included in a semiconductor device of a second embodiment.

A delay circuit 220A of the element E0 of the second embodiment illustrated in FIG. 9 may have a circuit configuration in which a selector 221A is disposed in place of the Ex-NOR circuit 121A of the element E0 (see FIG. 5) of the first embodiment. The delay circuit 220A may include a selector 221A and a flip-flop (FF) 222A.

Note that since one element E0 is illustrated in FIG. 9, a selection signal is represented by a 1-bit delay_code. In FIG. 9, a value of delay_code may be "0" or "1".

A first input terminal of the selector 221A may be connected to an output terminal of an inverter 11, and a second input terminal of the selector 221A may be connected to a signal line propagating a signal b, and a selection signal input terminal S may be connected to an output terminal of a selection signal control circuit 40.

That is, the first input terminal of the selector 221A may receive a signal a, the second input terminal of the selector 121A may receive the signal b, and the selection signal input terminal S may receive the selection signal (i.e., delay_code).

In the element E0 illustrated in FIG. 9, the signal d output from the selector 221A may vary with a value of the delay_code that is input into the selection signal input terminal S of the selector 221A.

When "1" is assigned to the value of the delay_code input into the selection signal input terminal S of the selector 221A, the selector 221A may output the signal d reflecting the signal a. When "0" is assigned to the value of the delay_code input into the selection signal input terminal S of the selector 221A, the selector 221A may output the signal d reflecting the signal b.

The FF 222A may be a flip-flop constituting the delay circuit 220A. The FF 222A may have a configuration similar to that of the FF 122A within the variable delay circuit 110 of the signal delay circuit 100 included in the semiconductor device of the first embodiment. Hence, the description of the FF 222A will be omitted.

Note that the circuit configuration of the element E0 illustrated in FIG. 9 may be applied in a manner similar to those of elements E1 and E2 of the second embodiment.

Next, a description will be given, with reference to FIGS. 10A and 10B, of operations of the element E0 of the variable delay circuit within the signal delay circuit 200 included in the semiconductor device of the second embodiment.

Figure 10A:
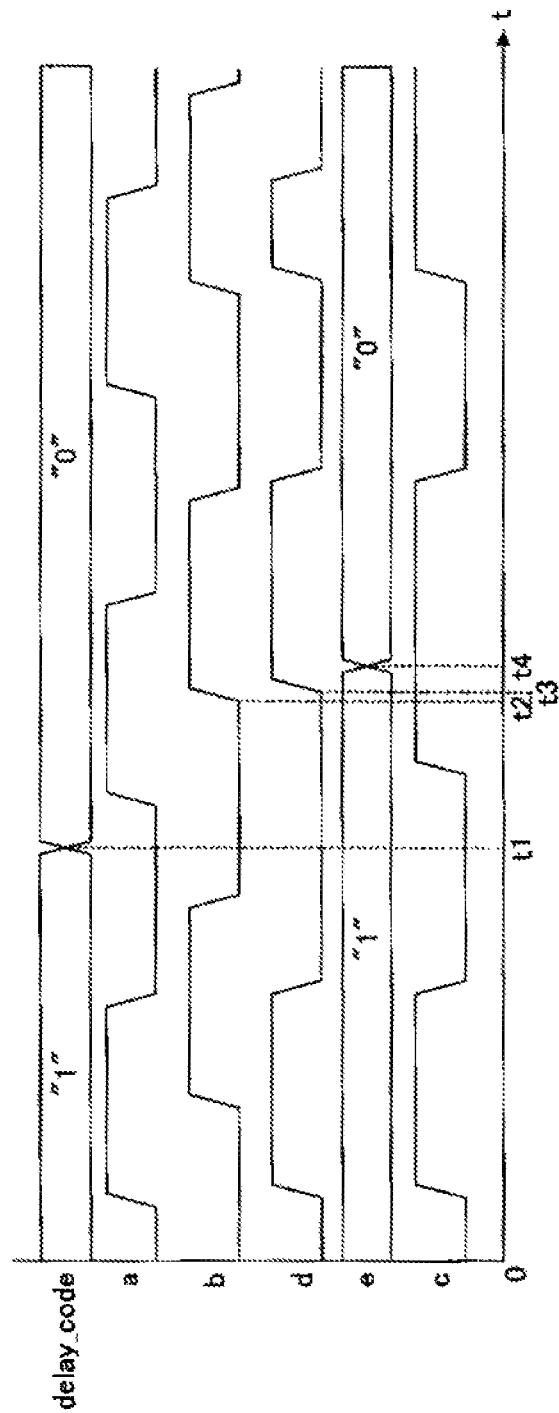
FIG. 10A is a timing chart illustrating operations of the element E0 of the variable delay circuit within the signal delay circuit 200 included in the semiconductor device of the second embodiment.
Figure 10B:
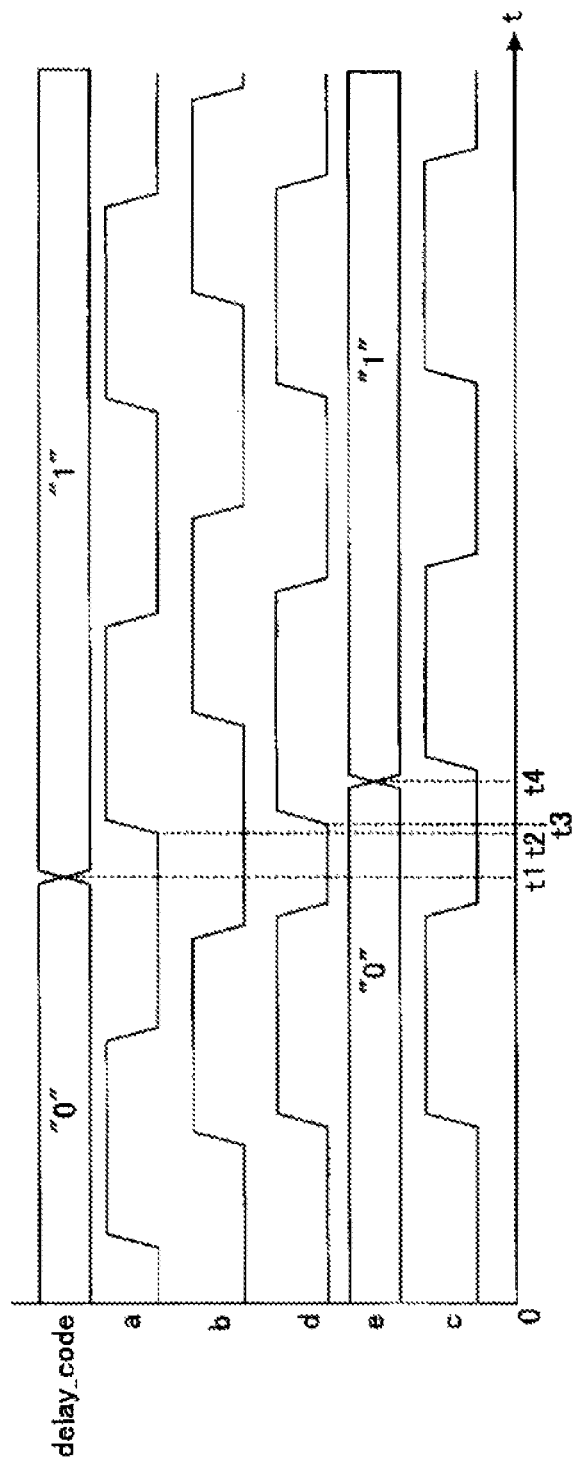
FIG. 10B is another timing chart illustrating operations of the element E0 of the variable delay circuit within the signal delay circuit 200 included in the semiconductor device of the second embodiment.

FIGS. 10A and 10B are timing charts illustrating operations of the element E0 of the variable delay circuit within the signal delay circuit 200 included in the semiconductor device of the second embodiment.

FIGS. 10A and 10B illustrate transitions of signal levels of delay_code, and signals a, b, c, d, and e. In FIGS. 10A and 10B, a horizontal axis indicates a time axis, and a rightward direction indicates a positive direction.

The timing charts illustrated in FIGS. 10A and 10B are the timing chart of one element E0 illustrated FIG. 9, and hence, the selection signal is represented by a 1-bit delay_code. In FIGS. 10A and 10B, a value of delay_code may be "0" or "1".

FIG. 10A illustrates a timing chart when the value of delay_ code is switched from "1" to "0", whereas FIG. 10B illustrates a timing chart when the value of delay_code is switched from "0" to "1".

In FIGS. 10A and 10B, since the signal b may represent the signal a that returns to the output terminal OUT (see FIG. 1) via the not-illustrated right-hand side elements, the signal b may fall behind the signal a.

Initially, as illustrated in FIG. 10A, the delay_code may be reflected in a value of the signal e to become "1" at time t0 when the value of delay_code is switched from "1" to "0".

In this case, since the signal e of a signal level at "1" is input into the selection signal input terminal S of the selector 21 of the element E0, the selector 21 may select the signal a and output the selected signal a.

Hence, the signal c representing the output of the selector 21 may have a signal waveform obtained by assigning a delay time of the selector 21 to the signal a during the signal e being "1" after the time t0.

In addition, since the delay_code is also input into the selection signal input terminal S of the selector 221A, the signal d representing the output of the selector 221A may have a signal waveform obtained by assigning a delay time of the selector 221A to the signal a during the delay_code being "1".

In this example, the delay time of the selector 21 is assumed to be equal to that of the selector 221A. Hence, the signal c and the signal d may have an identical phase while the value of the delay_code is "1".

Next, when the delay_code is switched into "0" at time t1, the signal d output from the selector 221A may have a switched waveform reflecting the signal b after time t1. Hence, the initial rise of the signal d after time t1 may have reflected the rise of the signal b at time t2, which may represent the rise at time t3.

Further, when the delay_code is switched into "0" at time t1, a delay_code of a signal level at "0" may be input into a data input terminal D of the FF 222A.

Since the signal d is an input clock signal of the FF 222A, the signal e supplied to the data output terminal Q of the FF 222A may reflect the value of the data input terminal D on receiving the rise at time t3, and the signal e may be switched into "0" at time t4.

When the signal e is switched into "0", the selector 21 may select the signal b. Hence, the signal c may have a signal waveform obtained by assigning a delay time of the selector 21 to the signal b thereafter.

Accordingly, the signal c not containing a noise resulting from the switching of the delay_code may thus be generated.

Next, as illustrated in FIG. 10B, the delay_code may be reflected in the value of the signal e such that the value of the signal e may become "0" at time 0 when the value of the delay_code is switched from "0" to "1".

In this case, since the signal e of the signal level at "0" is input into the selection signal input terminal S of the selector 21 of the element E0, the selector 21 may select the signal b and output the selected signal b.

Hence, the signal c representing the output of the selector 21 may have a signal waveform obtained by assigning a delay time of the selector 21 to the signal b during value of the signal e being "0" after the time t0.

In addition, since the delay_code is also input into the selection signal input terminal S of the selector 222A, the signal d representing the output of the selector 222A may have a signal waveform obtained by assigning a delay time of the selector 222A to the signal a during the delay_code being "0".

In this example, the delay time of the selector 21 is assumed to be equal to that of the selector 221A. Hence, the signal c and the signal d may have an identical phase while the value of the delay_code is "0".

Next, when the delay_code is switched into "1" at time t1, the signal d output from the selector 221A may have a switched waveform reflecting the signal a after time t1. Hence, the initial rise of the signal d after time t1 may have reflected the rise of the signal a at time t2, which may represent the rise at time t3.

Further, when the delay_code is switched into "1" at time t1, a delay_code having a signal level at "1" may be input into a data input terminal D of the FF 222A.

Since the signal d is an input clock signal of the FF 222A, the signal e supplied to the data output terminal Q of the FF 222A may reflect the value of the data input terminal D on receiving the rise at time t3, and the signal e may be switched into "1" at time t4.

When the signal e is switched into "1", the selector 21 may select the signal a. Hence, the signal c may have a signal waveform obtained by assigning a delay time of the selector 21 to the signal a thereafter.

Accordingly, the signal c not containing a noise resulting from the switching of the delay_code may thus be generated.

Next, a description will be given, with reference to FIG. 11, of the variable delay circuit within the signal delay circuit 200 included in the semiconductor device of the second embodiment.

Figure 11:
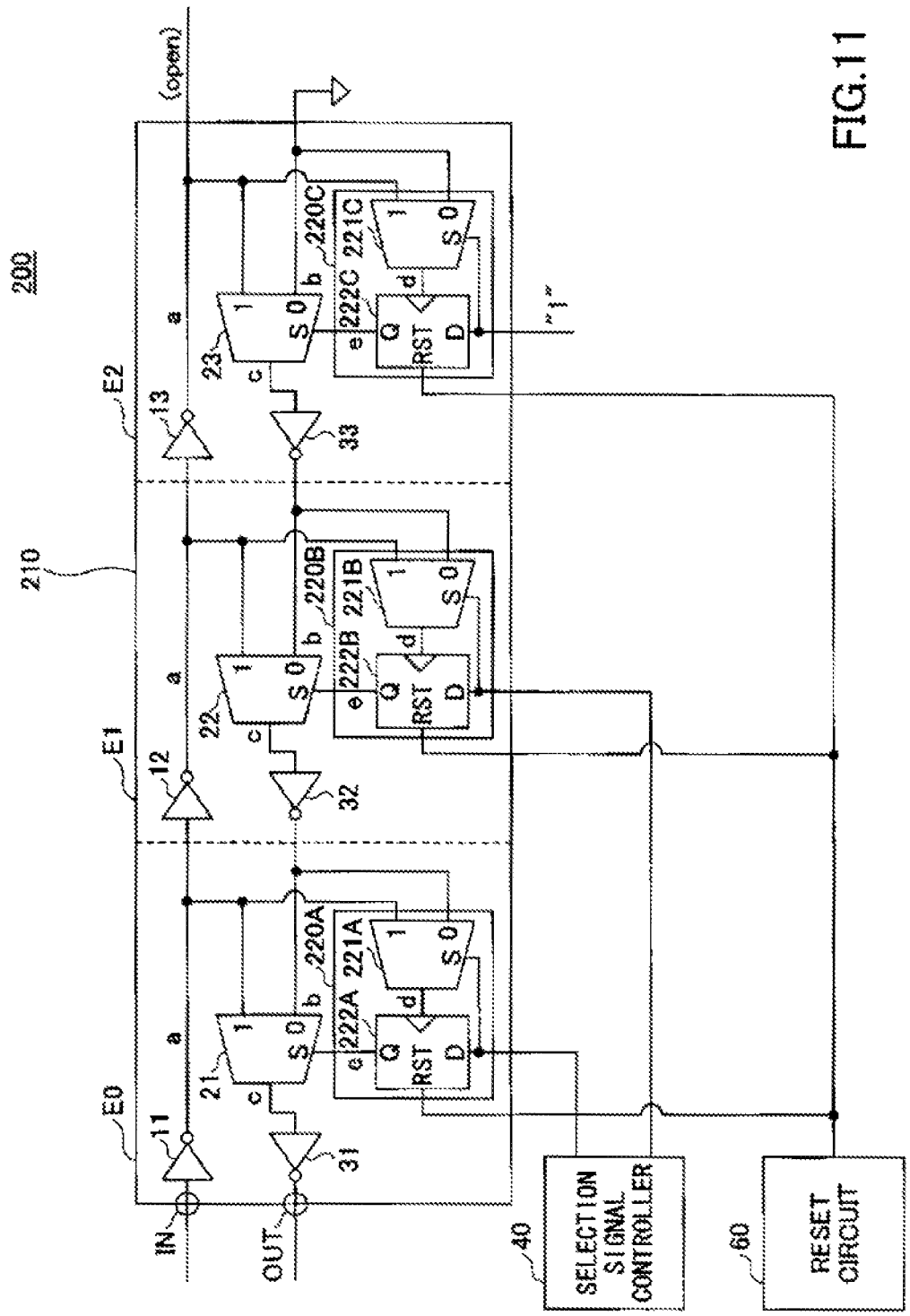
FIG. 11 is a circuit diagram illustrating the variable delay circuit within the signal delay circuit 200 included in the semiconductor device of the second embodiment.

FIG. 11 is a circuit diagram illustrating the variable delay circuit within the signal delay circuit 200 included in the semiconductor device of the second embodiment.

The variable delay circuit 210 within the signal delay circuit 200 included in the semiconductor device of the second embodiment may have a circuit configuration obtained by replacing the delay circuits 120A, 120B, and 120C of the variable delay circuit 110 (see FIG. 7) included in the semiconductor device of the first embodiment by delay circuits 220A, 220B, and 220C.

The delay circuit 220A may have a circuit configuration in which the Ex-NOR circuit 121A of the delay circuit 120A of the first embodiment is replaced by the selector 221A, as illustrated in FIG. 9.

Likewise, the delay circuits 220B and 220C may have circuit configurations in which the Ex-NOR circuits 121B and 121C of the delay circuit 120B and 120C of the first embodiment are replaced by the selectors 221B and 221C, respectively.

Hence, in the following description, those elements that are the same as or equivalent to those of the first embodiment are designated by the same reference numerals, and a description thereof will be omitted.

The element E0 of the variable delay circuit 210 illustrated in FIG. 11 is identical to the element E0 illustrated in FIG. 9. The signal b input into the selector 221A of the delay circuit 220A may be an output signal of an inverter 32 of the element E1.

The element E1 illustrated in FIG. 11 may have a circuit configuration in which the Ex-NOR circuit 121B of the delay circuit 120B of the element E1 of the first embodiment is replaced by the selector 221B. Note that the FF 222B of the delay circuit 220B may have a configuration similar to that of the FF 122B of the delay circuit 120B of the first embodiment.

In the delay circuit 220B, the signal d output from the selector 221B may vary with a value of the delay_code that is input into the selection signal input terminal S of the selector 221B.

When "1" is assigned to the value of the delay_code input into the selection signal input terminal S of the selector 221B, the selector 221B may output the signal d reflecting the signal a. When "0" is assigned to the value of the delay_code input into the selection signal input terminal S of the selector 221B, the selector 221B may output the signal d reflecting the signal b.

A data input terminal D of the FF 222B may be connected to the selection signal controller 40, a data output terminal Q of the FF 222B may be connected to the selection signal input terminal S of the selector 22, and a clock input terminal of the FF 222B may be connected to an output terminal of the selector 221B.

When a rise of the output of the selector 221B is input into the clock input terminal of the FF 222B, the FF 222B may reflect in the data output terminal Q a value of a selection signal that is input from the selection signal control circuit 40 to the data input terminal D.

In addition, reset data for resetting the value of the data output terminal Q may be input into a reset terminal RST from a reset circuit 60. The value of the data input terminal D of the FF 222B may, for example, be reset to "0" after turning on the power of the signal delay circuit 200.

The element E2 illustrated in FIG. 11 may have a circuit configuration in which the Ex-NOR circuit 121C of the delay circuit 120C of the element E2 of the first embodiment is replaced by the selector 221C. Note that the FF 222C of the delay circuit 220C may have a configuration similar to that of the FF 122C of the delay circuit 120C of the first embodiment.

One of input signals of the selector 221C may be an output signal of the inverter 13 of the element E2, whereas the other input signal may be a constant fixed value of "0".

An output terminal of the selector 221C may be connected to a clock input terminal of the FF 222C. Since a selection signal of a signal level clipped at "1" is input into the selector 221C, the selector 221C may constantly select the signal a and output the selected signal a.

A data input terminal D of the FF 222C may receive a selection signal of a signal level clipped at "1", an output signal of a data output terminal Q of the FF 222C may be input into a selection signal input terminal S of the selector 23, and a clock input terminal of the FF 222C may be connected to an output terminal of the selector 221C.

When a rise of the output of the selector 221C is input into the clock input terminal of the FF 222C, the FF 222C may reflect a selection signal of a signal level clipped at "1" in the data output terminal Q.

In addition, reset data for resetting the value of the data output terminal Q may be input into a reset terminal RST from a reset circuit 60. The value of the data input terminal D of the FF 222C may, for example, be reset to "0" after turning on the power of the signal delay circuit 200.

As described above, the signal delay circuit 200 included in the semiconductor device of the second embodiment may be able to output the signal output out not containing a noise resulting from the switching of the selection signal (i.e., delay_code [1:0]) in a manner similar to the signal delay circuit 200 included in the semiconductor device of the first embodiment.

Further, when switching the selection signal (i.e., delay_code [1:0]), the signal delay circuit 200 may await the switching of the input signal, and may then input the switched selection signal into the selection signal input terminal S of the selector.

This may indicate that the delay circuit may cause the switching of the selection signal input into the selector to occur after the switching of the signal level of the input signal input into the selector serving as the signal turning point.

Hence, the second embodiment may, in a manner similar to the first embodiment, provide the semiconductor device capable of exhibiting a high response speed of the output signal with respect to the input signal and being suitable for high-speed operations, and information processing apparatus having such a semiconductor device.

Note that in the above circuit configuration of the second embodiment, the delay circuits 220A, 220B, and 220C include the selectors 221A, 221B, and 221C, respectively. However, the delay circuits 220A, 220B, and 220C may, for example, exclude the respective selectors 221A, 221B, and 221C when the second embodiment has the following circuit configuration illustrated in FIG. 12.

Figure 12:
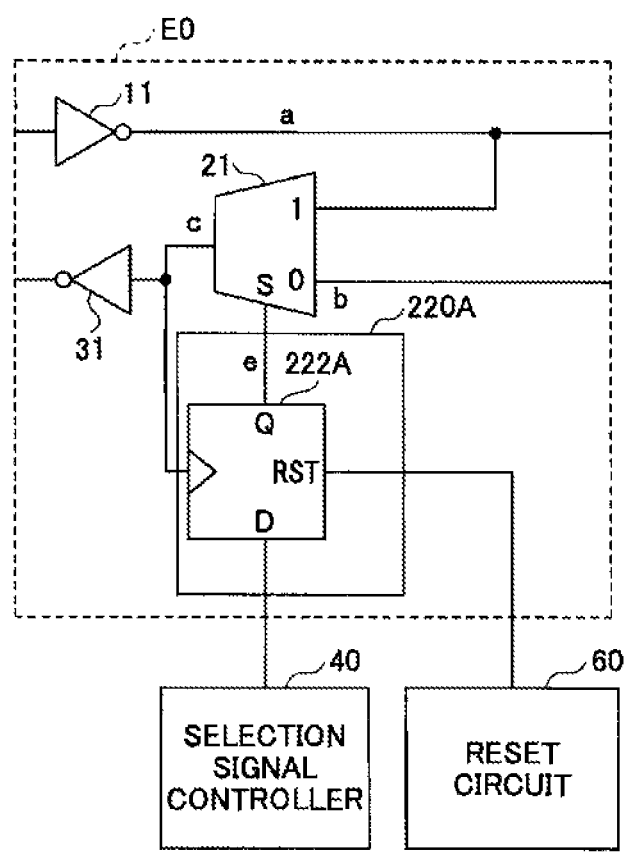
FIG. 12 is a diagram illustrating a part of the signal delay circuit 200 included in the semiconductor device of a modification of the second embodiment.

FIG. 12 is a diagram illustrating a part of the signal delay circuit 200 included in the semiconductor device of a modification of the second embodiment. A circuit illustrated in FIG. 12 corresponds to the element E0 illustrated in FIGS. 9 and 11.

As illustrated in FIG. 12, the delay circuit 220A may include the FF 222A alone, and the output terminal of the selector 21 may be connected to the clock input terminal of the FF 222A.

Since the selector 21 selects the signal a and the signal b to output the selected signals a and b, the selector 21 may select two input signals identical to those selected by the selector 221A illustrated in FIG. 9 and input the selected input signals to the clock input terminal of the FF 222A.

Note that the selector 221A illustrated in FIG. 9 may operate by receiving the delay_code as a selection signal, whereas the selector 21 may operate by receiving as the selection signal the signal e output from the data output terminal Q of the FF 222A. Hence, technically speaking, the operations of the element E0 illustrated in FIG. 12 may partially differ from the operations of the element E0 illustrated in FIG. 9.

However, in the element E0 illustrated in FIG. 12, when the selector 21 serves as a signal turning point, the signal delay circuit 200 may await the switching of the signal level of the signal a or b input into the selector 21 and cause the FF 221A to operate based on the rise of the signal c. Accordingly, the signal e may be input into the selector 21 such that the selector 21 serves as the signal turning point.

Thus, the delay circuit may cause the switching of the selection signal input into the selector to occur after the switching of the signal level of the input signal input into the selector serving as the signal turning point, which may be the same observation made in the element E0 illustrated in FIG. 12 and in the element E0 illustrated in FIG. 9.

Hence, the modification of the second embodiment may, in a manner similar to the first embodiment, provide the semiconductor device capable of exhibiting a high response speed of the output signal with respect to the input signal and being suitable for high-speed operations, and information processing apparatus having such a semiconductor device.

Accordingly, the embodiments and modification described above may provide a semiconductor device that may be capable of suppressing a noise from being contained in the output signal, exhibiting a high response speed of the output signal with respect to the input signal and outputting an output signal suitable for a high-speed operation, and an information processing apparatus having such a semiconductor device.

Although the embodiments are numbered with, for example, "first," or "second", these numbers do not specify priorities of the embodiments. Numerous other variations and modifications will be made, which is apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device including an input terminal to receive an input signal and an output terminal to output an output signal, the output signal being obtained by assigning a delay to the input signal, the semiconductor device, comprising:
   a plurality of delay elements connected in series with the input terminal and each configured to assign the delay to the input signal input from the input terminal;
   a plurality of selectors connected to respective output sides of the delay elements and each configured to select one of output signals of the delay elements based on a selection signal for selecting the one of the output signals of the delay elements so as to return the selected one of the output signals to the output terminal; and
   a plurality of delay circuits connected to the plurality of selectors, respectively, and each configured to delay switching of the selection signal input to a corresponding one of the plurality of selectors, when the corresponding one of the plurality of selectors serves as a signal turning point, until a signal level of the input signal input to the corresponding one of the plurality of selectors serving as the signal turning point is switched,
   wherein each of the plurality of delay circuits includes:
   an exclusive NOR arithmetic circuit configured to compute an exclusive NOR of a first input and a second input of one of the plurality of selectors which the corresponding delay circuit is connected to; and a flip-flop connected to an output of the exclusive NOR arithmetic circuit and configured to receive an output signal of the exclusive NOR arithmetic circuit as an input clock of the flip-flop and output the selection signal to the one of the plurality of selectors in response to the input clock.

2. A semiconductor device including an input terminal to receive an input signal and an output terminal to output an output signal, the output signal being obtained by assigning a delay to the input signal, the semiconductor device, comprising:

a plurality of delay elements connected in series with the input terminal and each configured to assign the delay to the input signal input from the input terminal;

a plurality of selectors connected to respective output sides of the delay elements and each configured to select one of output signals of the delay elements based on a selection signal for selecting the one of the output signals of the delay elements so as to return the selected one of the output signals to the output terminal; and a plurality of delay circuits connected to the plurality of selectors, respectively, and each configured to delay switching of the selection signal input to a corresponding one of the plurality of selectors, when the corresponding one of the plurality of selectors serves as a signal turning point, until a signal level of the input signal input to the corresponding one of the plurality of selectors serving as the signal turning point is switched, wherein each of the plurality of delay circuits includes:

a second selector configured to select one of a first input and a second input of one of the plurality of selectors which the corresponding delay circuit is connected to, based on the selection signal; and a flip-flop connected to an output of the second selector and configured to receive an output signal of the second selector as an input clock of the flip-flop and output the selection signal to the one of the plurality of selectors in response to the input clock.

3. An information processing apparatus, comprising:

an arithmetic processing unit;

a main storage unit; and a memory controller having the semiconductor device as claimed in claim 1 and configured to transfer data between the arithmetic processing unit and the main storage unit.

\* \* \* \* \*